United States Patent [19]
Baillie et al.

[11] Patent Number: 5,391,994
[45] Date of Patent: Feb. 21, 1995

[54] METHOD FOR MEASURING SURFACE RESISTIVITY USING SQUARE ELECTRODES AND MULTIPLYING SURFACE RESISTANCE MEASUREMENTS BY A CORRECTION FACTOR

[75] Inventors: Matthew B. Baillie, Emmaus, Pa.; Ming-Chung Jon, Princeton Junction, N.J.

[73] Assignee: AT&T Corp., Murray Hill, N.J.

[21] Appl. No.: 999,079

[22] Filed: Dec. 31, 1992

[51] Int. Cl.⁶ ..................... G01R 27/14; G01N 27/04
[52] U.S. Cl. .................................. 324/717; 324/149; 324/715; 324/724
[58] Field of Search ............... 324/691, 696, 715, 717, 324/719, 722, 724, 446, 149, 158 P, 72.5, 754; 364/571.01

[56] References Cited

U.S. PATENT DOCUMENTS

| | | | |
|---|---|---|---|
| 3,487,301 | 12/1969 | Gardner et al. | 324/717 |
| 3,995,213 | 11/1976 | Robinso et al. | 324/715 |
| 5,041,242 | 8/1991 | Fowle et al. | 252/511 |

OTHER PUBLICATIONS

T. L. Welsher et al., "Design for Electrostatic Discharge (ESD) Protection in Telecommunication Products", *AT&T Technical Jrnl.*, May-Jun., 1990, pp. 77–96.
M. C. Jon et al., "Tape and Reel Packaging—An ESD Concern", 1988 *EOS/ESD Symposium Proceedings*, pp. 15–23.
"Standard Test Methods for D-C Resistance or Conductance of Insulating Materials", published by *American Society for Testing and Materials*, pp. 1–16.

*Primary Examiner*—Gerard R. Strecker
*Assistant Examiner*—Diep Do
*Attorney, Agent, or Firm*—Oleg E. Alber

[57] ABSTRACT

This invention embodies a method and apparatus for determination of surface resistivity ($\rho$) of materials to be used for a desired purpose. The surface resistivity is obtained by measuring surface resistance (R) of at least one square area of the material, and converting the surface resistance into a surface resistivity ($\rho$) by a correction factor K ($K=\rho/R$) whenever the total area of the material is greater than three square area. The surface resistance is measured by placing a pair of square electrodes, spaced from each other a distance equal to the side of the square, applying measuring voltage potential to the electrodes, and determining the surface resistance of said at least one square area. The surface resistivity of materials of any size can be obtained by multiplying the surface resistance value by a correction factor determined for the size of the material being investigated. The surface resistivity may be confirmed by cutting out three square long areas of the material and measuring the surface resistivity of each separate three square area, resulting in simultaneous surface resistivity measurement. The maximum error in applying the correction factor to convert the resistance into the surface resistivity is less than 25 percent, which is small compared to those produced by the conventional surface resistivity meters available on the market, which measure the resistance in increments of 10.

8 Claims, 9 Drawing Sheets

ρ/R (RATIO OF SURFACE RESISTIVITY TO SURFACE RESISTANCE)

TOTAL NUMBER OF SQUARES

METHOD FOR MEASURING SURFACE RESISTIVITY USING SQUARE ELECTRODES AND MULTIPLYING SURFACE RESISTANCE MEASUREMENTS BY A CORRECTION FACTOR

FIELD OF THE INVENTION

This invention concerns the measurement of surface resistivity using square measuring electrodes.

BACKGROUND OF THE INVENTION

Electrostatic Discharge (ESD) can seriously damage electronic devices and affect the operation of the systems that contain them. An article by Terry L. Welsher et al., "Design for Electrostatic Discharge (ESD) Protection In Telecommunication Products", *AT&T Technical Journal*, May–June 1990, pages 77–96, and an article by M-C Jon et al. "Tape and Reel Packaging-An ESD Concern", *Electrical Overstress/Electrical Discharge Symposium Proceedings*, EOS-10, 1988, pages 15–23, describe effects of ESD on the electronic devices. Control procedures are, therefore, required to minimize the effects of ESD. Control refers to the materials and procedures that are employed in the manufacturing and use environments to keep static potentials and discharge currents low, below a withstand threshold of the electronic devices. Withstand threshold is the highest voltage a device can withstand without changing its operating characteristics. One such procedure is the control of the surface resistivity of the materials used for ESD related applications, such as work surfaces and tape-and-reel packages. Movement of an object, e.g., an electronic device, relative to a work surface or a pocket in a tape-and-reel package may lead to a triboelectric effect and, thus, to an ESD. The triboelectric effect may be defined as a static charge which is generated whenever two different materials come into contact and are then separated.

Surface resistivity measurements are used to classify materials into conductive, static-dissipative, and insulative categories. It is critical to correctly measure the surface resistivity of the materials used for ESD-related applications to correctly appraise the category of the material. In general, only the static-dissipative materials are recommended for the work surfaces and for the tape-and-reel packages. The need to measure the surface resistivity of a small area, such as inside of a recessed pocket of a carrier tape, is critical in ESD-safe tape-and-reel packages because: (1) each recessed pocket, by itself, is capable of discharging the triboelectric charge in the device packaged in that pocket, and (2) the pockets in a carrier tape, dependent on the process to make them conductive, could be electrically insulated from each other.

The surface resistivity ($\rho$) is defined as the electrical resistance across the surface of an object measured between the opposite sides of a square on that surface, and is expressed as ohms per square (ohms/□). The surface resistivity of a material can be obtained by measuring the surface resistance (R) between two electrodes placed on that material at the opposite sides of a square area of the material. But the measured resistance is numerically equal to the surface resistivity only if the electrodes are made to fit the sample size so that no current flows outside the electrode areas (no end-effect). To minimize the end-effect, most commercial surface resistivity meters are equipped with large rectangular electrodes, e.g., several inches long. As a result, these meters are not suitable for measuring small areas in such materials as cover tapes or inside recessed pockets of carrier tapes used to package surface mount devices in tape-and-reel packaging operation.

In a publication entitled "Standard Test Methods for D-C Resistance or Conductance of Insulating Materials", D257, pages 1–16, published by *American Society for Testing and Materials*, numerous test methods and apparatus are proposed. These methods are involved, requiring specific apparatus, formation of holes in the specimen, use of mercury or water as one of the electrodes, etc. Furthermore, if the measured resistance is not properly converted by the correction factor, the surface resistivity could be off by an order of magnitude or higher.

In view of the above, there is a need for a simple method and apparatus that can correctly measure the surface resistivity of areas of a material.

SUMMARY OF THE INVENTION

This invention embodies a method and apparatus for determination of surface resistivity ($\rho$) of materials to be used for a desired purpose. The surface resistivity is obtained by measuring surface resistance (R) of at least one square area of the material, and converting the surface resistance into a surface resistivity ($\rho$) by a correction factor K ($K=\rho/R$) whenever the total area of the material is greater than three square area. The surface resistance is measured by placing a pair of square electrodes, spaced from each other a distance equal to the side of the square, applying measuring voltage potential to the electrodes, and determining the surface resistance of said at least one square area. The surface resistivity is obtained by multiplying the surface resistance by the correction factor which is determined according to the following formula:

$$K = \rho/R \approx 1 + 2 \sum_{j=0}^{n} \frac{1}{3(2j+1)},$$

wherein n and j are integers. The surface resistivity for the material is confirmed by separating, e.g. cutting out, the three square areas from the total of the material, and measuring the surface resistance and surface resistivity of each such a separated area.

DETAILED DESCRIPTION

This invention embodies a technique and apparatus that uses two square electrodes spaced a distance of one square each from another to measure the surface resistance (R) of a material between the electrodes and to determine the surface resistivity ($\rho$) of the material. The relationship of the surface resistivity ($\rho$) of a sample and its resistance (R) measured by the square electrodes arranged in the simple configuration, may be explained with reference to an equivalent circuit including a pair of square electrodes placed upon a sheet of material and spaced from each other a distance equal to the side of the square. When the length, L, of the side of the electrodes and the width, D, of the sample are made to be the same size, the current flow would be restricted to the area between the electrodes, resulting in $\rho/R=L/D$. However, this will hold only for an area of a sample equal to three squares, two end squares being occupied by the spaced electrodes and one square being intermediate the two end squares. For areas greater than 3 squares it is necessary to use correction factor due to the end-effect caused by the square electrodes whenever the total area of the material being measured is greater than the area of 3 adjoining squares of the material. The correction factor, K, due to this end-effect, can be estimated using an equivalent circuit model. Alternatively, the surface resistivity is determined experimentally for various positions on the sample by measuring the surface resistance of a test piece, whose size is 3 squares long, cut out from the material.

The electrodes are being used in pairs of equal size. The size of the electrodes is selected to be equal to or smaller than the size of the sample to be measured. The size of the electrodes is selected to enable an operator to place these electrodes inside small recessed pockets in carrier tapes for resistance measurements. The measured resistance is corrected using a correction factor that takes into account the spacing (i.e., area) between the electrodes and the end-effect produced by these square electrodes on a sample of any size.

This equivalent circuit model approach is used to determine the ratio of $\rho$ and R measured by the square electrodes placed on a sample whose size may vary. In order to apply this model to the calculation of the correction factor, the following assumptions are made: (1) the contact resistance of the square electrodes is negligible, (2) the sample is homogeneous, and (3) the thickness of the sample is the same over the length of interest. Homogeneous means that the sample is of a material having a single characteristic, for example a static-dissipative material which does not include any conductive non-uniformities, such as electrical conductors or semiconductors.

Figure 2:
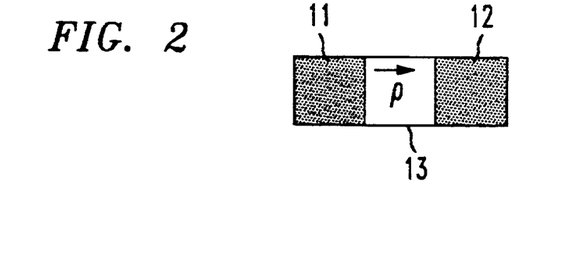
FIG. 2 is a schematic representation of an equivalent circuit model for the resistance measurement made by two square electrodes spaced one square apart, in a sample size=3 squares, with an arrow indicating the current path.

In an equivalent circuit model shown in FIG. 2, $\rho$ is numerically equal to R measured between two square electrodes 11 and 12 spaced one square apart in a sample, 13, of 3-square size. Therefore, for individual, e.g., cut-out, pieces of material which are three squares long, $\rho$ may be determined by measuring R of each piece. However, as the size of the material increases beyond the 3 square long size, a small deviation in the $\rho$ and R values from unity takes place. In view of this, a ratio of $\rho/R$, called a conversion factor, K, is needed to convert surface resistance, R, to surface resistivity for sizes of material greater than 3 squares. This factor may be calculated for various sizes. For a sample whose size is larger than 3 squares, such as when $A=6\square$ (FIG.3), $$\frac{1}{R} \approx \frac{1}{\rho} + \frac{1}{3\rho}, \text{ and } K \text{ or } \frac{\rho}{R} \approx 1.33.$$

Figure 4:
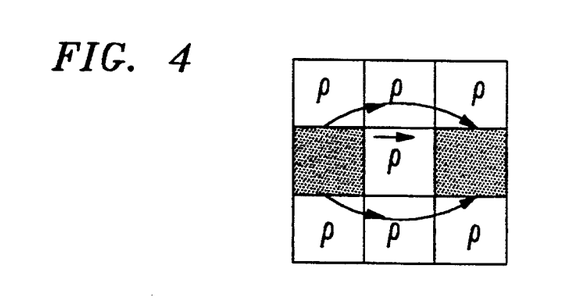
FIG. 4 is a schematic representation of an equivalent circuit model for the resistance measurement made by two square electrodes, spaced one square apart, in a square sample size=9 squares, with arrows indicating the current paths.
Figure 5:
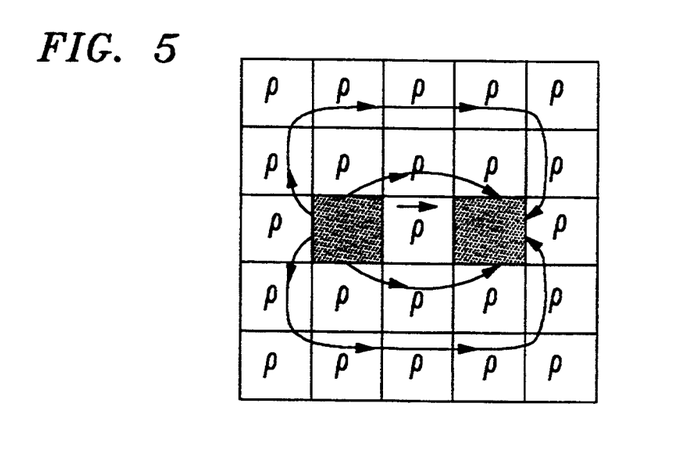
FIG. 5 is a schematic representation of an equivalent circuit model for the resistance measurement made by two square electrodes spaced one square apart, in a square sample size=25 squares, with arrows indicating the current paths.
Figure 6:
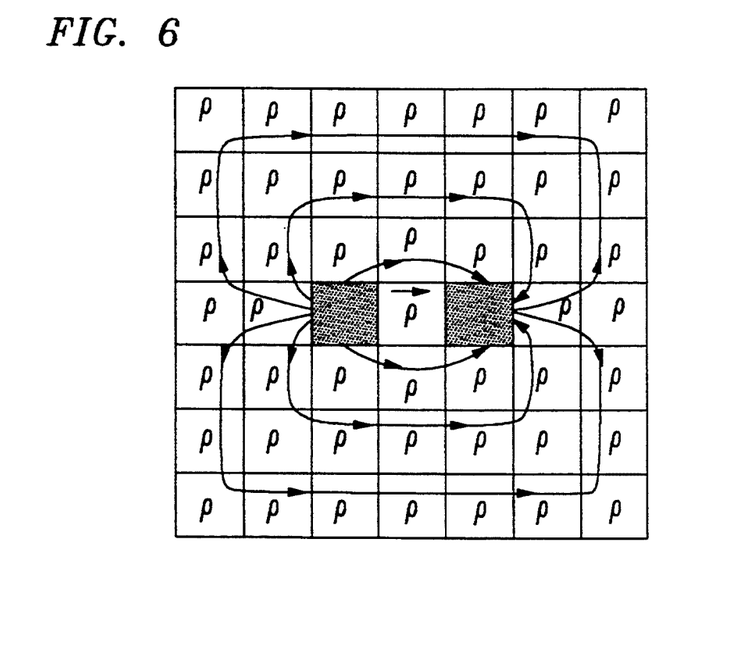
FIG. 6 is a schematic representation of an equivalent circuit model for the resistance measurement made by two square electrodes spaced one square apart, in a square sample size=49 squares, with arrows indicating the current paths.

For samples which are greater than $A=6\square$, and which are of a square shape formed by a number of the squares of the material, such as 9, 25, 49, etc., K is determined as follows:

when $A = 9\square$(FIG. 4), $\frac{1}{R} \approx \frac{1}{\rho} + \frac{2}{3\rho}$, and $\frac{\rho}{R} \approx 1.67$, when $A = 25\square$(FIG. 5), $$\frac{1}{R} \approx \frac{1}{\rho} + \frac{2}{3\rho} + \frac{2}{9\rho}, \text{ and } \frac{\rho}{R} \approx 1.89, \text{ and}$$

when $A = 49\square$(FIG. 6), $$\frac{1}{R} \approx \frac{1}{\rho} + \frac{2}{3\rho} + \frac{2}{9\rho} + \frac{2}{25\rho}, \text{ and } \frac{\rho}{R} = 2.02.$$

For samples which are larger than $6\square$ and especially for samples which are much larger than samples represented by FIGS. 4, 5 and 6, K may be calculated using a different approach. For A which is larger than $6\square$ and which is of a square shape, such as $A=(3+2n)^2\square$, one can write that $$K = \rho/R \approx 1 + 2 \sum_{j=0}^{n} \frac{1}{3(2j + 1)}$$

wherein n and j are integers, and wherein n can be viewed as current paths in addition to the current path in the squares that surround the 9 squares of the sample shown in FIG. 4. Thus, for a square sample shape as shown in FIG. 4, n=0, as shown in FIG. 5, n=1, and as shown in FIG. 6, n=2, and so on.

Figure 7:
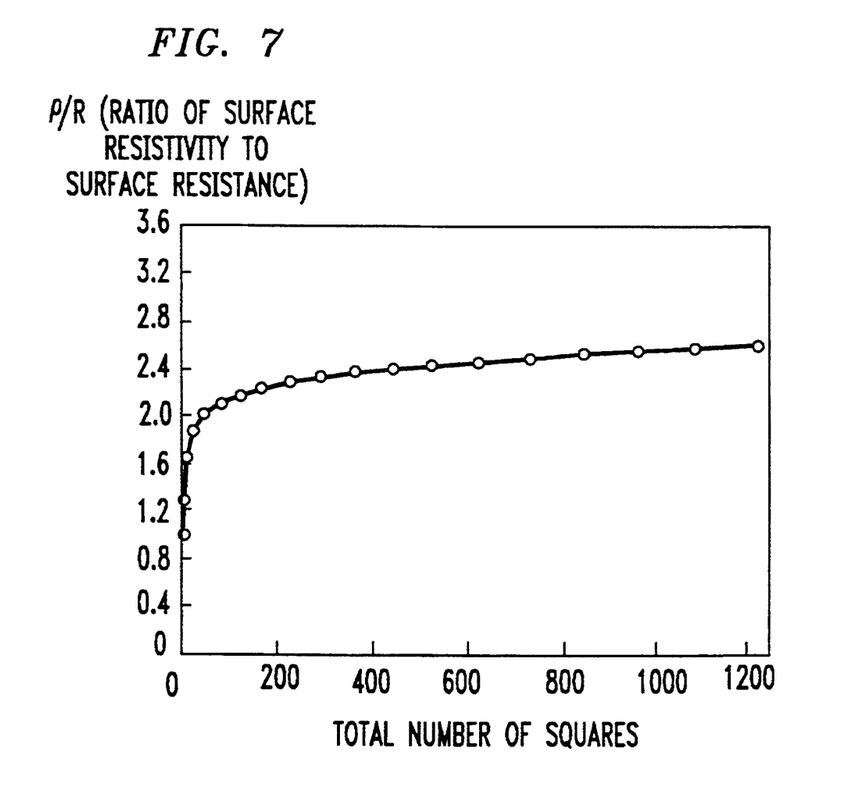
FIG. 7 is a plot of the ratio of surface resistivity to surface resistance versus the total number of squares for a sample size up to 1225 squares.

The plot of ρ/R versus A for the latter equation is shown in FIG. 7. As seen in this plot, for A up to 1225□, n=16 or less, i.e., the correction factor (K=ρ/R) is less than 2.5. As the sample size increases, K converges asymptotically notwithstanding the calculations are oversimplified. K can also be easily determined by experiments, taking advantage of the simplicity of the square shape electrodes and spacing between them one square apart during resistance measurements. This is because ρ can be taken as the resistance value measured between two square electrodes in a 3-square size sample, shown in FIG. 2.

Figure 1:
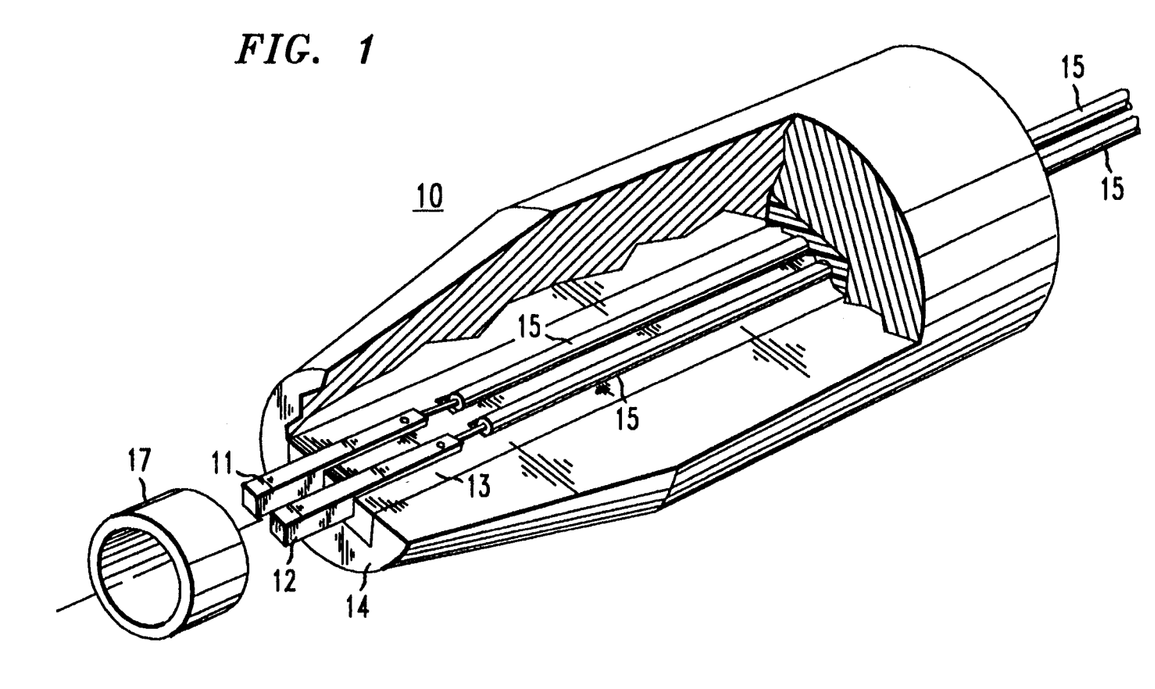
FIG. 1 is a schematic representation of an exemplary measuring device used in practicing this invention.

In FIG. 1 is shown, partially in cross-section an exemplary probe 10 including a pair of elongated probe electrodes, 11 and 12, which are embedded in an insulator body, 13, which in turn is secured within a handle, 14. Wires, 15, electrically connected to the electrodes, are used to interconnect the probe to a measuring device. Alternatively, wires 15 may interconnect the electrodes to terminals (not shown) on handle 14, which are in turn connected to leads (not shown) interconnecting the probe to a measuring device. The electrodes are of a square cross-section, at least at an area of contact to the material to be tested, and are spaced from each other the distance of a side of a square of the same cross-section. The size of the electrodes is equal to or smaller than the size of the sample to be measured. For use in measuring the surface resistance of such packaging systems as tape-and-reel, the size of the electrodes may range from 1 to 15 mm square in cross-section, preferably from 1.5 to 10 mn square. The electrodes are set to project from an insulator 17 sufficiently to establish contact with the surface of the sample being tested. A projection length as small as $2.54 \times 10^{-3}$ cm could be sufficient. The total length of each electrode may be from a length only minutely fitting into insulator body 13 to a length where the electrodes would project from handle 14. The handle may be of any suitable material and if made of metal, it should be grounded. It is desirable that the handle is selected so that the probe, when placed upon a material to be measured, exerts upon each square a force of ≧140K Pa (2.1 psi) or higher. This assures an effective contact between the surface of each square and the surface of the material being tested.

In the exemplary embodiment, the probe was made with two sizes of square electrodes: 3 mm×3 mm and 2 mm×2 mm in cross-section and 10 mm long. Other cross-section areas of the electrodes and their lengths suitable for incorporation into a measuring probe device are possible. In the preferred embodiment the electrodes are of an oxygen-free high conductivity (OFHC) copper material. Other metals, such as brass and stainless steel, having characteristics of high electrical conductivity and resistance to oxidation could be used.

A Keithley ® 617 electrometer was selected for use with the probe, because it was capable of measuring the resistances within a range of from 0.1Ω up to $1 \times 10^{16}$Ω (i.e., from conductive to insulative). The voltage source of the electrometer may be preset within a range of from −100 to +100 volts. In the particular set of tests described hereinbelow, the voltage was set at 100 volts during the resistance measurement and the system was calibrated using known 1 GΩ and 1000 GΩ resistors.

Figure 8:
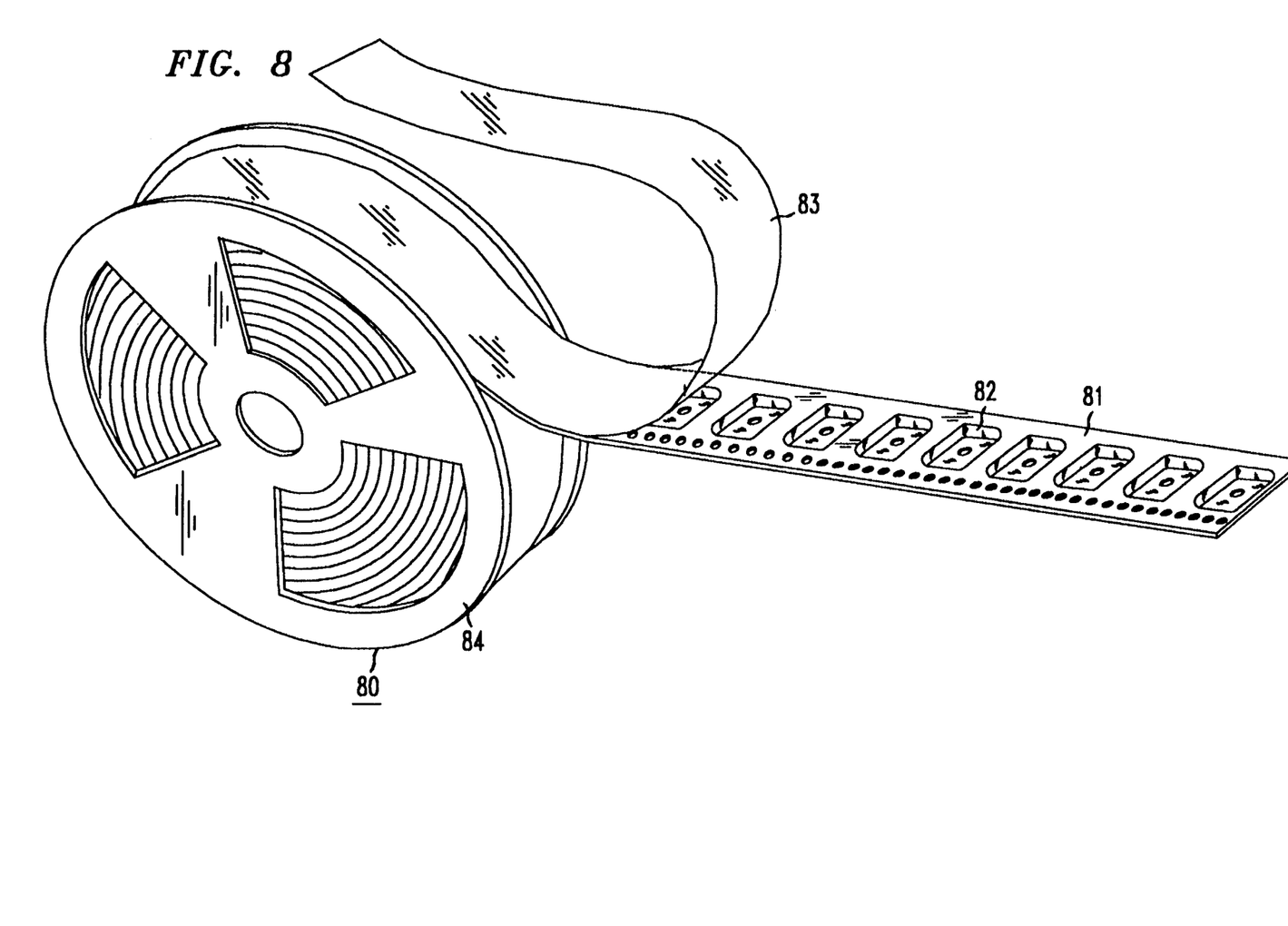
FIG. 8 is a schematic representation in perspective of a reel, a carrier tape with pockets and a cover tape.

In FIG. 8 is shown a representative tape-and-reel arrangement, 80, wherein a carrier tape, 81, having pockets, 82, for carrying articles, such as electronic elements (not shown), covered with a cover tape, 83, is taken upon a reel, 84, for storage and transportation of the elements to a different location, e.g., to a customer.

Measurements were conducted by placing square electrodes 11 and 12 of the probe, spaced one square apart, on a designated area of a material being tested, such as a cover tape, a carrier tape, or a large sheet material. After the electrometer was energized, the resistance reading was recorded on the electrometer. Thereafter, the probe was moved in succession to different locations and the resistance reading was recorded for each different location. Using this method, R and ρ were measured for the cover tapes and the carrier tapes of various sizes using probes with different size electrodes. The R was the resistance measured in a sample whose size was 3□, i.e., each piece of the sample was sized to accommodate only the two square electrodes plus one insulative square spacer. The ρ and R of a large size sheet material were also measured using these square electrodes.

The concept of using square electrodes to measure the surface resistivity of any size sample is demonstrated with reference to (1) two different size cover tapes, (2) two different size carrier tapes, and (3) one large size sheet material. These sizes are selected randomly, and they are not related to each other.

Figure 9:
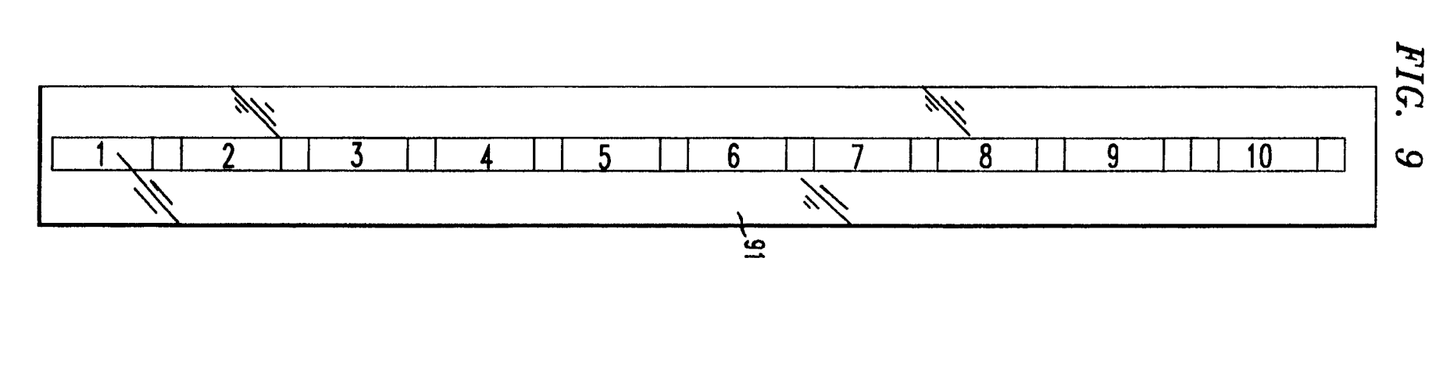
FIG. 9 is a schematic representation of a static-dissipative cover tape having 10 marked areas three square long each on the cover tape.

First, two different size static-dissipative cover tapes were tested, i.e., 21 mm wide and 9 mm wide cover tapes. The cover tapes were of an insulative material. Both static-dissipative cover tapes were coated with antistatic agents on one side, forming a static-dissipative side, while the other side remained insulative. On the insulative side, ten areas (each area=3□ long) were marked along each tape as shown in FIG. 9. Since the cover tape was transparent, the electrodes could be placed on the static-dissipative side for the resistance measurements. This procedure minimizes the effect of the markings on the resistance measurement. The ten marked areas were then cut out for the individual surface resistivity measurements.

Figure 10:
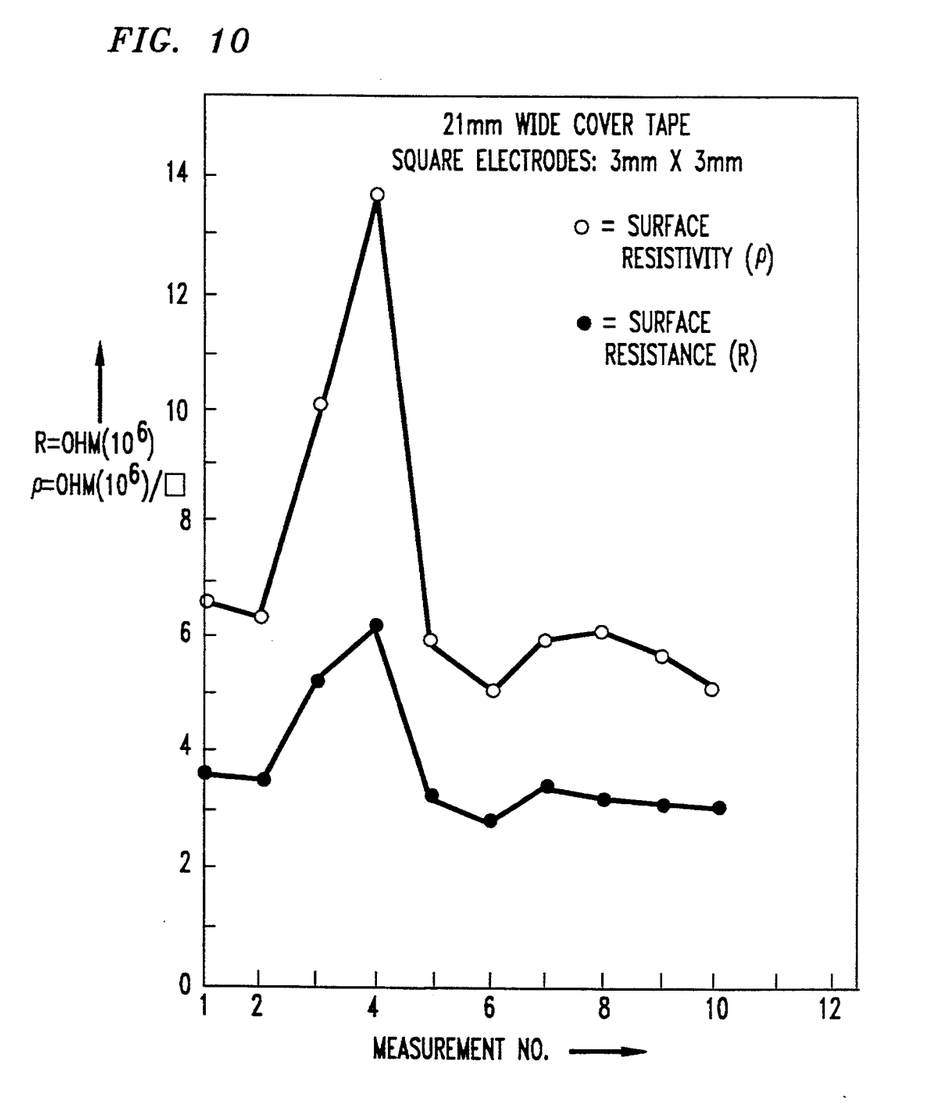
FIG. 10 is a plot of surface resistivity and surface resistance measurements for a 21 mm wide static-dissipative cover tape.

The measurements began with a 21 mm wide cover tape. The results are shown in FIG. 10. As seen in this figure, ρ tracks R very well. The average ratio of ρ/R for the ten data is 1.87. According to the equivalent circuit model, for A=49□, the ρ/R is 2.02 (see FIG. 7); i.e., $A=(7 \times a)^2=(7 \times mm)^2=(21 \ mm)^2$, where "a" is the size of the square electrodes. The agreement is not precise but is rather good. The difference between the actually measured surface resistivity and one obtainable by using the correction factor with surface resistance measurements is less than 25 percent. This is small compared to those produced by conventional resistivity meters available on the market, which measure the resistance in increments of 10.

Figure 11:
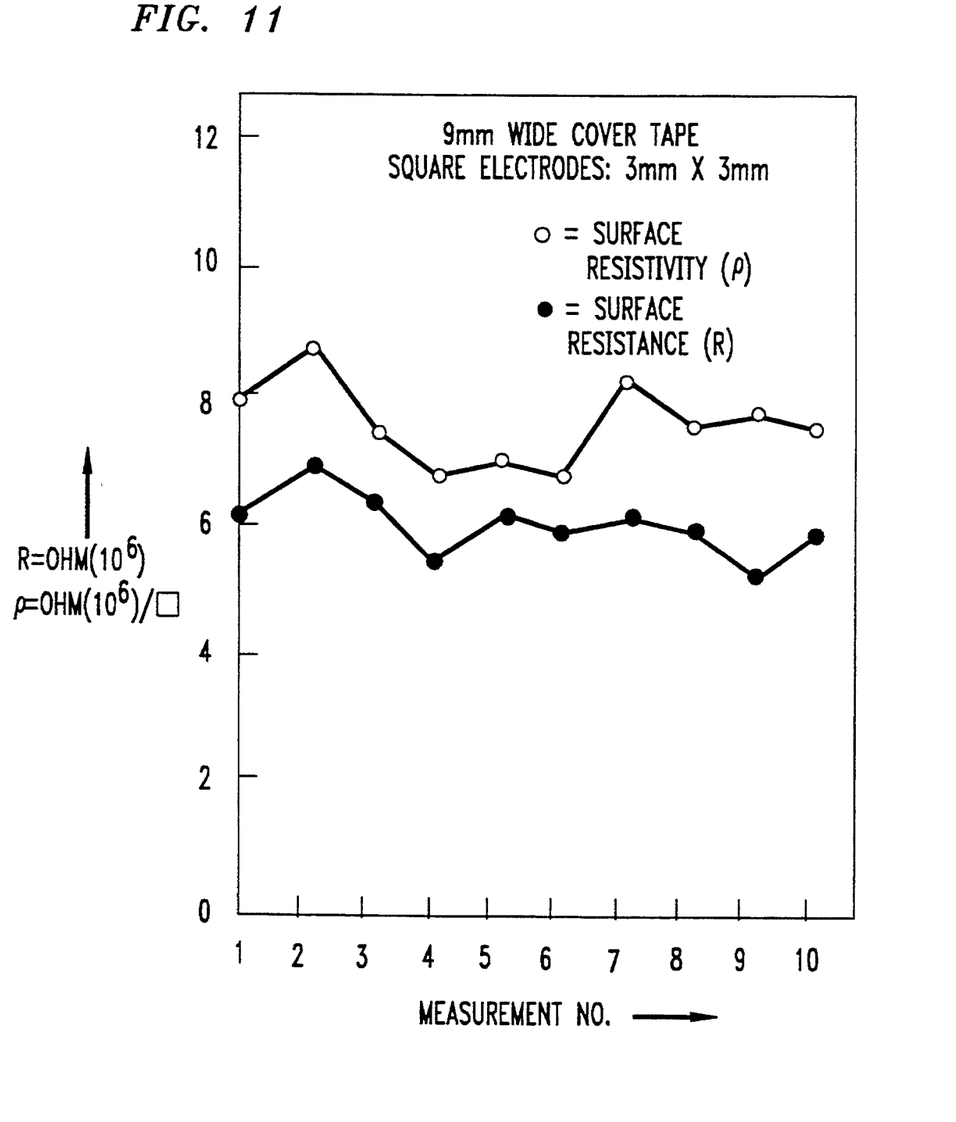
FIG. 11 is a plot of surface resistivity and surface resistance measurements for a 9 mm wide static-dissipative cover tape.

The same measurement procedures were repeated on a narrower, 9 mm wide, cover tape. In this case, the electrode configuration was similar to that shown in FIG. 4, because a 3 mm electrode would occupy one-third of the 9 mm wide cover tape. The results of R and ρ for the ten data are shown in FIG. 11. Once again, ρ tracks R very well. The average ratio of ρ/R for the 10 data is 1.33. As calculated by the equivalent circuit model shown in FIG. 4, the ρ/R is 1.67. The agreement again is not precise but is rather good.

Figure 12:
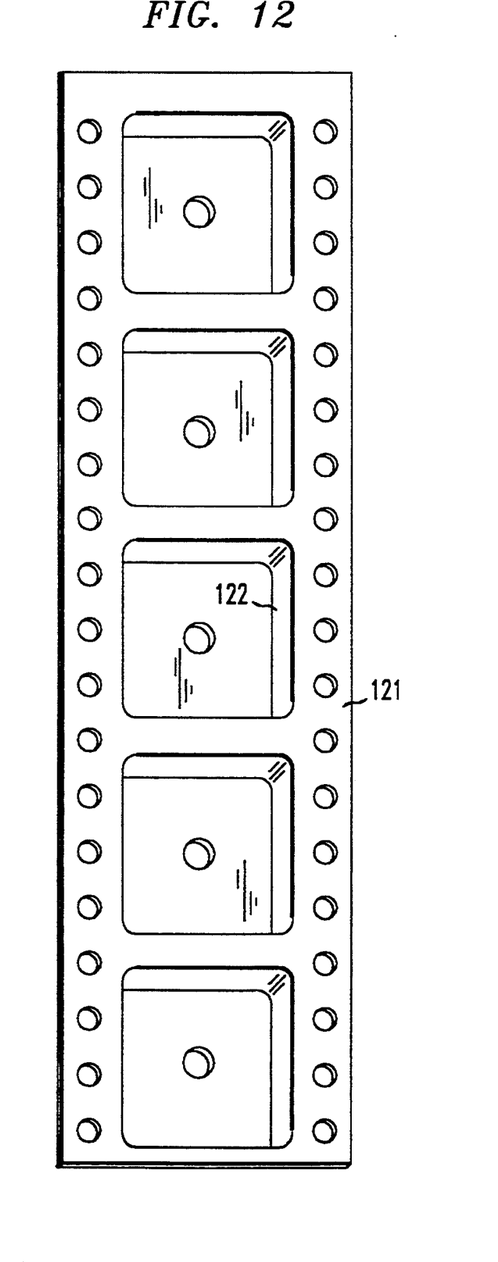
FIG. 12 is a schematic representation of a carrier tape having holes in recessed pockets in the carrier tape.

Surface resistivities of two different carrier tapes provided with recessed pockets were also measured with the square electrode probe. The recessed size of each pocket in one carrier tape, e.g. shown in FIG. 12, is about 26 mm×26 mm, and in another tape, e.g. shown in FIG. 8, is about 9 mm×6 mm. Since the pockets in the carrier tapes have holes in the center (≈1 to 2 mm diameter as shown in FIGS. 8 and 12), the square electrodes were placed either in the areas above the holes or in the areas below the holes in the pockets when measuring the resistance.

Figure 13:
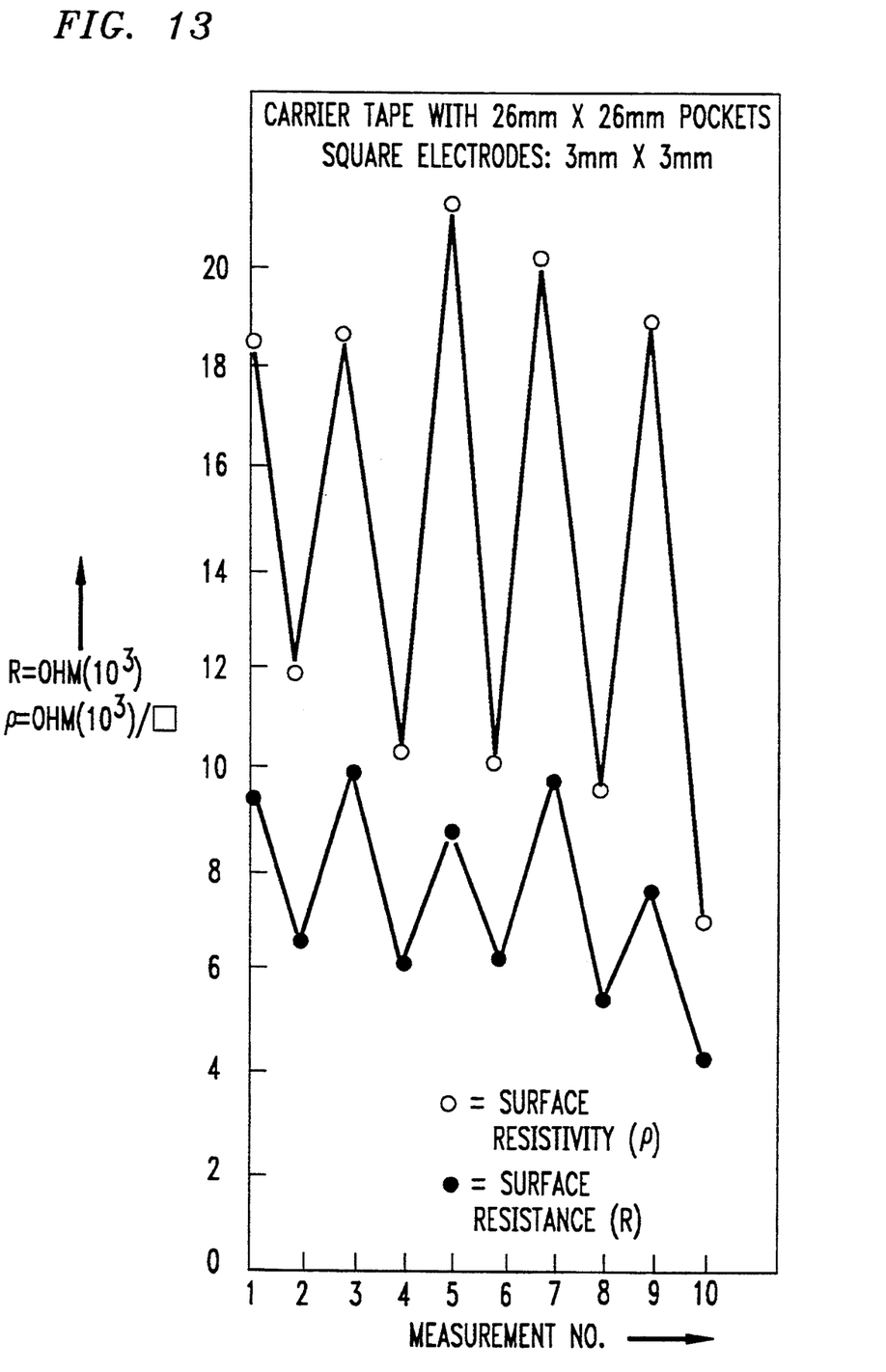
FIG. 13 is a plot of surface resistivity and surface resistance measurements for a carrier tape with 26 mm×26 mm recessed pockets.

Because the size of recessed 26 mm×26 mm pockets, 122, in carrier tape, 121, shown in FIG. 12 were large relative to the size of the square electrodes, the probe with 3 mm square electrodes could be easily placed inside the pocket for the surface resistance measurements. The square electrodes were placed first in the top-half of the pocket, and the surface resistance was measured. The surface resistance of the bottom-half of the pocket was measured next. The resistance measurements were repeated for 5 recessed pockets. Thereafter, the ten areas of three squares each were cut out, and the surface resistivity measurements were repeated, by measuring the resistance of each cut-out 3□ area. The results are shown in FIG. 13. The measured resistance values in the top-half of the pockets are higher than those in the bottom-half of the pockets in this large size carrier tape. Nevertheless, $\rho$ tracks R very well, despite the large variation in the data.

These results clearly show that the present method of using the small square electrodes to measure the surface resistivity is sensitive enough to detect the local variation of the resistance change. The average ratio for this tape for $\rho/R$ is 1.91, which is in good agreement with that predicted by the equivalent circuit model, i.e., $\rho/R=1.89$ for $A=25\square=(5\times a)^2=(5\times 3 \text{ mm})^2=(15 \text{ mm})^2$. The reason for assuming $A=25\square$, is consistent with the configuration of placing the square electrodes in the top-half or in the bottom-half of the pocket [pocket size=$(26 \text{ mm})^2$] when measuring the resistance.

Figure 3:
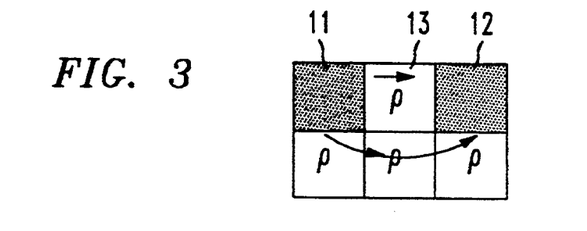
FIG. 3 is a schematic representation of an equivalent circuit model for the resistance measurement made by two square electrodes, spaced one square apart, in a sample size=6 squares, with arrows indicating the current path.
Figure 14:
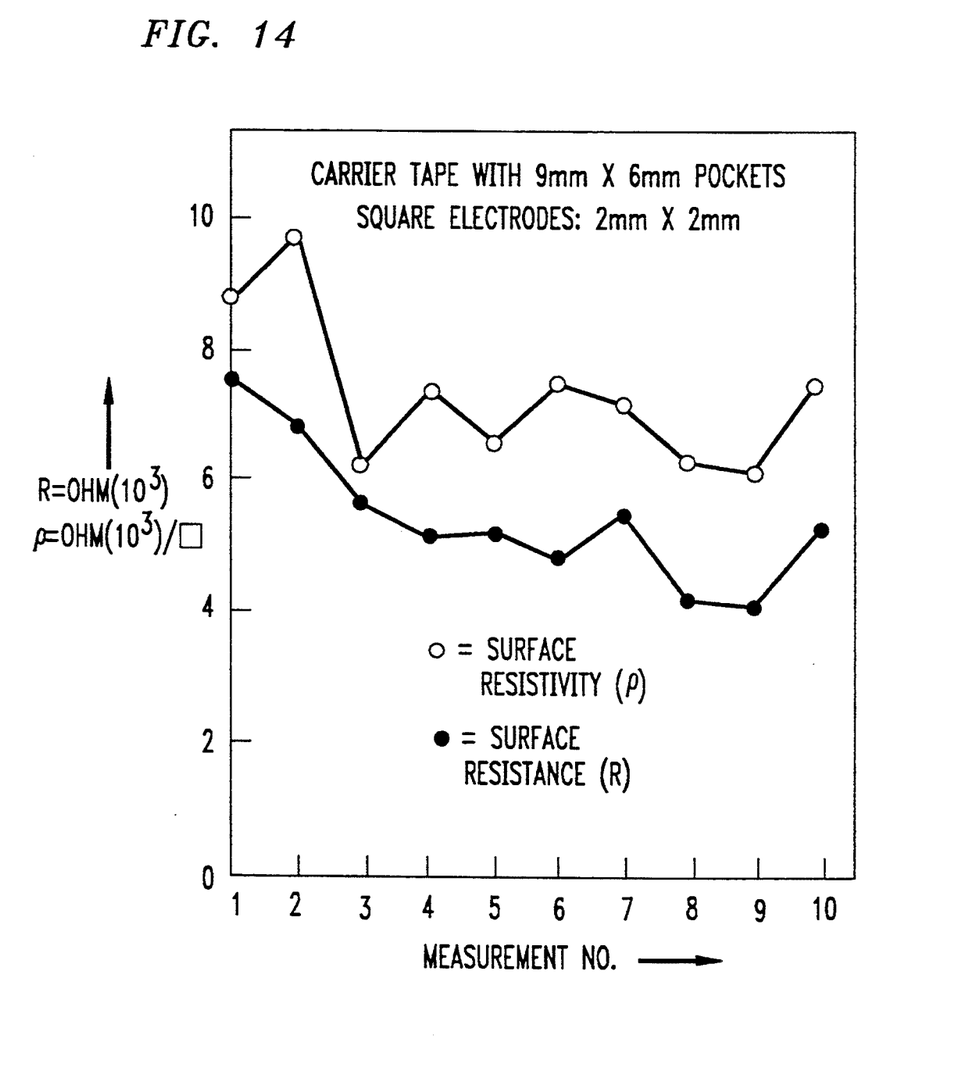
FIG. 14 is a plot of surface resistivity and surface resistance measurements for a carrier tape with 9 mm×6 mm recessed pockets.

For another carrier tape with smaller recessed pockets (9 mm×6 mm), smaller 2 mm square electrodes were used to measure $\rho$ and R of this carrier tape. The arrangement of the 2 mm square electrodes placed inside the pockets, was very similar to that shown in FIG. 3. After R of the ten 3□ long areas was measured, the 3□ long areas were cut out, and R ($\rho$) of these ten areas was remeasured. The results are shown in FIG. 14. Again, $\rho$ tracks R reasonably well. The average ratio of $\rho/R$ for the ten data is 1.38. The calculated $\rho/R$ using the equivalent circuit model shown in FIG. 3 is 1.33, which agrees well with the experimental data.

To find out the applicability of using the equivalent circuit model to calculate the ratio of $\rho/R$ of a very large sample, the $\rho$ and R of a 200 mm×200 mm large sheet material was measured. The sheet was made of polymer base material loaded with conductive powder. Ten surface resistance measurements were made on the center region of the sheet material using the probe with 3 mm square electrodes. The average surface resistance was $R=1.025\times10^5\Omega$ for the 10 data measured by the square electrodes. Ten areas (each area=3□ long) were cut out for the surface resistivity measurements using the square electrodes. The average surface resistivity for the cut-out samples was $\rho=2.400\times10^5\Omega/\square$. The above measurements show that the average ratio of $\rho/R$ is $$\frac{2.400\times 10^5}{1.025\times 10^5} = 2.34$$

for measurements with square electrodes. This ratio corresponds to $A=289\square$ in FIG. 7, which represents an area of 51 mm×51 mm on the sheet material whose size is 200 mm×200 mm. This result suggests that the effective area of the current paths may only occupy a small surface area on the sheet material during the resistance measurement.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A method of determining surface resistivity of a material for use in ESD-safe tape-and-reel packaging of electronic devices, which comprises placing a pair of square electrodes of equal size, spaced by a distance equal to the side of the square, in contact with a region of a surface area of a material the surface resistivity ($\rho$) of which is to be determined, measuring the surface resistance ($R_a$) of said area of the material by applying a steady voltage to one of the square electrodes, converting the surface resistance ($R_a$) value into the surface resistivity ($\rho$) value of the area by multiplying the surface resistance value by a correction factor. (K) of less than 2.5, and using the surface resistivity ($\rho$) value for determining whether the material is suitable for ESD-safe tape-and-reel packaging of electronic devices.

2. The method of claim 1 in which the correction factor is determined by separating a region of material corresponding to three squares long from said area of material, measuring the resistance ($R_r$) of such three square long region, and dividing the resistance value of the region ($R_r$) by the resistance value of the area ($R_a$).

3. The method of claim 1, in which the cross-sectional area of each of said electrodes ranges from 1 to 15 mm square.

4. The method of claim 3, in which the cross-sectional area of said electrodes ranges from 1.5 to 10 mm square.

5. The method of claim 4, in which the cross-sectional area of said electrodes is 3 mm square.

6. The method of claim 4, in which the cross-sectional area of said electrodes is 2 mm square.

7. The method of claim 1, in which said voltage is applied within a range of from −100 to +100 volts.

8. The method of claim 1, in which the value of K is confirmed for each surface area by using $$K = \rho/R \approx 1 + 2 \sum_{j=0}^{n} \frac{1}{3(2j+1)}$$

wherein n is an integer ranging from 0 to 16.

* * * * *